United States Patent
Kuriki et al.

(10) Patent No.: US 8,940,610 B2
(45) Date of Patent: Jan. 27, 2015

(54) ELECTRODE FOR ENERGY STORAGE DEVICE AND METHOD FOR MANUFACTURING THE SAME

(75) Inventors: Kazutaka Kuriki, Kanagawa (JP);
Tamae Moriwaka, Kanagawa (JP);
Satoshi Murakami, Kanagawa (JP);
Shunpei Yamazaki, Tokyo (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 454 days.

(21) Appl. No.: 13/085,234

(22) Filed: Apr. 12, 2011

(65) Prior Publication Data

US 2011/0254128 A1   Oct. 20, 2011

(30) Foreign Application Priority Data

Apr. 16, 2010   (JP) .................................. 2010-095305

(51) Int. Cl.
*H01L 21/331*   (2006.01)
*H01L 21/02*    (2006.01)
*H01L 29/04*    (2006.01)

(52) U.S. Cl.
CPC ........ *H01L 29/045* (2013.01); *H01L 21/02532* (2013.01); *Y02E 60/122* (2013.01); *H01L 21/0262* (2013.01); *H01L 21/02672* (2013.01)
USPC .................................. 438/381; 257/E21.008

(58) Field of Classification Search
CPC ............ H01M 2004/027; H01M 4/626; H01L 21/02532
USPC .................... 438/381; 257/E21.008, E29.003, 257/E29.004
See application file for complete search history.

(56) References Cited

U.S. PATENT DOCUMENTS

| | | |
|---|---|---|
| 5,225,371 A | 7/1993 | Sexton et al. |
| 5,461,250 A | 10/1995 | Burghartz et al. |
| 5,578,520 A | 11/1996 | Zhang et al. |
| 5,670,798 A | 9/1997 | Schetzina |
| 5,726,487 A | 3/1998 | Sameshima et al. |
| 5,753,541 A | 5/1998 | Shimizu |
| 5,879,976 A | 3/1999 | Fujiwara |
| 5,923,966 A | 7/1999 | Teramoto et al. |
| 6,066,547 A | 5/2000 | Maekawa |

(Continued)

FOREIGN PATENT DOCUMENTS

| | | |
|---|---|---|
| EP | 1465268 A | 10/2004 |
| JP | 04-168769 A | 6/1992 |

(Continued)

*Primary Examiner* — Wael Fahmy
*Assistant Examiner* — Sarah Salerno
(74) *Attorney, Agent, or Firm* — Fish & Richardson P.C.

(57) ABSTRACT

An electrode for an energy storage device with less deterioration due to charge and discharge, and a method for manufacturing thereof are provided. Further, an energy storage device having large capacity and high endurance can be provided. In an electrode of an energy storage device in which an active material is formed over a current collector, the surface of the active material is formed of a crystalline semiconductor film having a {110} crystal plane. The crystalline semiconductor film having a {110} crystal plane may be a crystalline silicon film containing a metal element which reacts with silicon to form a silicide. Alternatively, the crystalline semiconductor film having a {110} crystal plane may be a crystalline semiconductor film containing silicon as its main component and also containing germanium and a metal element which reacts with silicon to form a silicide.

22 Claims, 9 Drawing Sheets

(56) References Cited

U.S. PATENT DOCUMENTS

| | | |
|---|---|---|
| 6,118,151 A | 9/2000 | Tsutsu |
| 6,482,684 B1 | 11/2002 | Yamazaki |
| 7,503,975 B2 | 3/2009 | Yamazaki et al. |
| 7,824,801 B2 | 11/2010 | Kogetsu et al. |
| 7,838,147 B2 | 11/2010 | Kawase et al. |
| 8,017,269 B2 | 9/2011 | Jung et al. |
| 2002/0008286 A1 | 1/2002 | Yamazaki et al. |
| 2002/0038889 A1 | 4/2002 | Yamazaki et al. |
| 2002/0043660 A1 * | 4/2002 | Yamazaki et al. ............... 257/59 |
| 2002/0043662 A1 | 4/2002 | Yamazaki et al. |
| 2004/0201023 A1 | 10/2004 | Yamazaki et al. |
| 2009/0317726 A1 | 12/2009 | Hirose et al. |
| 2010/0092856 A1 | 4/2010 | Hirose et al. |

FOREIGN PATENT DOCUMENTS

| | | |
|---|---|---|
| JP | 2002-093705 A | 3/2002 |
| JP | 2004-311141 A | 11/2004 |
| JP | 2006-196447 A | 7/2006 |
| JP | 2006-269306 A | 10/2006 |
| JP | 2007-194204 A | 8/2007 |
| JP | 2007-305424 A | 11/2007 |
| JP | 2009-134917 A | 6/2009 |
| JP | 2009-252579 A | 10/2009 |

* cited by examiner (100)

(111)

(110)

ELECTRODE FOR ENERGY STORAGE DEVICE AND METHOD FOR MANUFACTURING THE SAME

BACKGROUND OF THE INVENTION

1. Field of the Invention

One embodiment of the present invention relates to an electrode for an energy storage device and a method for manufacturing the electrode for an energy storage device. Further, one embodiment of the present invention relates to an energy storage device having the electrode for an energy storage device.

Note that the energy storage device indicates all elements and devices which have a function of storing energy.

2. Description of the Related Art

In recent years, the development of energy storage devices such as a lithium-ion secondary battery and a lithium-ion capacitor has been conducted.

In the above electrode for an energy storage device, an active material is formed over a surface of a current collector. As the active material, a material to/from which ions functioning as carriers can be adsorbed or desorbed, such as carbon or silicon is used. For example, silicon has higher theoretical capacity than carbon and is advantageous in increasing the capacity of the energy storage device. However, the volume of silicon expands when silicon is combined with lithium during charging. On the other hand, the volume of silicon decreases when lithium is desorbed during discharging. The volume expansion and volume contraction of the active material cause mechanical damage of the negative electrode and charge-discharge cycle characteristics of the energy storage device is deteriorated. Thus, some techniques for mitigating the effect caused by the volume expansion of the active material have been proposed (for example, Patent Document 1).

REFERENCE

[Patent Document 1] Japanese Published Patent Application No. 2009-134917

SUMMARY OF THE INVENTION

An object of one embodiment of the present invention is to provide an electrode for an energy storage device with less deterioration due to charge and discharge and to provide a method for manufacturing the same. Further, an object of one embodiment of the present invention is to provide an energy storage device which has large capacity and high endurance.

The gist of one embodiment of the present invention is that in an electrode of an energy storage device in which an active material is formed over a current collector, a region which becomes a surface of the active material is formed of a crystalline semiconductor film having a {110} crystal plane. Note that the crystalline semiconductor film having a {110} crystal plane may be a crystalline silicon film containing a metal element which reacts with silicon to form a silicide, or a crystalline semiconductor film containing silicon as its main component and also containing a metal element which reacts with silicon to form a silicide and germanium.

Further, another embodiment of the present invention is that, in a negative electrode of an energy storage device in which an active material is formed over a current collector, the active material has a stacked structure, and the stacked structure is a stack of a crystalline semiconductor film being in contact with the current collector and containing silicon as its main component and also containing germanium, and a crystalline silicon film being in contact with the crystalline semiconductor film containing silicon as its main component and also containing germanium and having a {110} crystal plane.

Further, another embodiment of the present invention is that, in an electrode of an energy storage device in which an active material is formed over a current collector, the active material has a stacked structure, and the stacked structure is a stack of a crystalline semiconductor film being in contact with the current collector, having a {110} crystal plane, and containing silicon as its main component and also containing a metal element and germanium, and a crystalline silicon film having a {110} crystal plane and containing a metal element.

Further, another embodiment of the present invention is a method for manufacturing an electrode for an energy storage device, which includes the steps of: after introducing a metal element into an amorphous semiconductor film containing silicon as its main component and also containing germanium and being formed over a current collector, conducting a crystallization process; and forming as an active material a crystalline semiconductor film having a {110} crystal plane and containing silicon as its main component and also containing germanium and the metal element.

Further, another embodiment of the present invention is a method for manufacturing an electrode for an energy storage device, which includes the steps of: after forming an amorphous silicon film over an amorphous semiconductor film containing silicon as its main component and also containing germanium and being formed over a current collector, conducting a crystallization process by irradiation with a laser beam; and providing a crystalline silicon film having a {110} crystal plane in the uppermost layer of an active material.

Further, another embodiment of the present invention is a method for manufacturing an electrode for an energy storage device, which includes the steps of: forming an amorphous silicon film over an amorphous semiconductor film containing silicon as its main component and also containing germanium and being formed over a current collector; after introducing a metal element into the amorphous silicon film, conducting a crystallization process; and providing a crystalline silicon film having a {110} crystal plane and containing the metal element in the uppermost layer of an active material.

Note that in the crystalline semiconductor film having a {110} crystal plane and containing silicon as its main component and also containing germanium, the crystalline silicon film having a {110} crystal plane, and the crystalline silicon film having a {110} crystal plane and containing the metal element, the orientation ratio on the {110} plane is preferably high. Typically, the orientation ratio on the {110} plane is preferably greater than or equal to 20% and less than or equal to 100%.

The above current collector is a negative electrode current collector; typically, stainless steel, copper, nickel, tungsten, or molybdenum can be employed. Further, the above active material is a negative electrode active material. Furthermore, the above metal element is a metal element which reacts with silicon to form a silicide; typically, zirconium, titanium, hafnium, vanadium, niobium, tantalum, chromium, molybdenum, tungsten, cobalt, nickel, or platinum can be employed.

Note that equivalent planes including (110), (101), (011), and equivalent planes in which "1" in each of the above-described planes is "−1" are denoted as {110} plane.

According to one embodiment of the present invention, an electrode for an energy storage device with less deterioration due to charge and discharge can be manufactured. Further, according to one embodiment of the present invention, an energy storage device which has large capacity and high endurance can be manufactured.

DETAILED DESCRIPTION OF THE INVENTION

Figure 1:
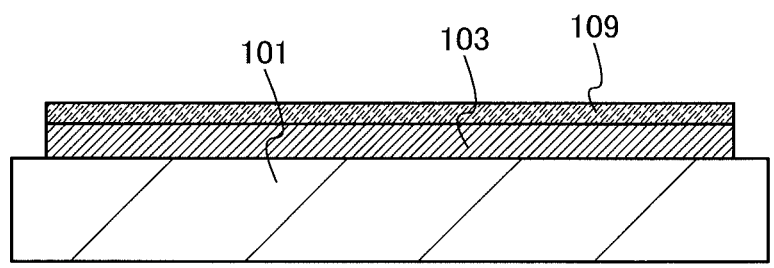
FIG. 1 is a cross-sectional view illustrating a negative electrode of an energy storage device.

Hereinafter, embodiments of the present invention will be described with reference to the drawings. Note that the invention is not limited to the following description, and it will be easily understood by those skilled in the art that various changes and modifications can be made without departing from the spirit and scope of the invention. Thus, the present invention should not be interpreted as being limited to the following description of the embodiments. In description with reference to the drawings, in some cases, the same reference numerals are used in common for the same portions in different drawings. Further, in some cases, the same hatching patterns are applied to similar parts, and the similar parts are not necessarily designated by reference numerals.

Embodiment 1

In this embodiment, an electrode for an energy storage device which is one embodiment of the present invention and a manufacturing method thereof is described.

One embodiment of an electrode for an energy storage device of this embodiment is described with reference to FIG. 1.

FIG. 1 illustrates one embodiment of an electrode (negative electrode) of an energy storage device. The electrode includes a current collector 103, and an active material on one surface of the current collector 103, which is formed using a crystalline semiconductor film 109 having a {110} crystal plane and containing silicon as its main component and also containing germanium and a metal element. The current collector 103 is formed over a substrate 101. The {110} plane of the crystalline semiconductor film can be detected from an electron backscattering pattern (EBSP) or X-ray diffraction (XRD).

For the substrate 101, glass, quartz, ceramic such as alumina, or plastic having heat resistance enough to withstand later heat treatment can be used.

The current collector 103 is formed as appropriate using a conductive material which can be used as a negative electrode current collector and has heat resistance enough to withstand later heat treatment. Examples of the conductive material which can be used as the negative electrode current collector include, but are not limited to, stainless steel, copper, nickel, tungsten, molybdenum, and the like. An oxide conductive material can be used as the current collector 103. Typical examples of the oxide conductive material include indium oxide including tungsten oxide, indium zinc oxide including tungsten oxide, indium oxide including titanium oxide, indium tin oxide including titanium oxide, indium tin oxide, indium zinc oxide, and indium tin oxide to which silicon oxide is added. Note that the current collector 103 may have a foil shape, a plate shape, or a net shape. With such a shape, the current collector 103 can hold its shape by itself, and the substrate 101 is therefore not essential.

In the crystalline semiconductor film 109 having a {110} crystal plane and containing silicon as its main component and also containing germanium and the metal element, the concentration range of germanium is preferably greater than or equal to 0.1 at. % and less than or equal to 10 at. %, further preferably, greater than or equal to 1 at. % and less than or equal to 5 at. %. In the case where the concentration of germanium is less than 0.1 at. % or greater than 10 at. %, the orientation ratio on {110} plane is decreased. Further, in the crystalline semiconductor film 109 having a {110} crystal plane and containing silicon as its main component and also containing germanium and the metal element, the orientation ratio on the {110} plane is preferably high. Typically, the orientation ratio on the {110} plane is preferably greater than or equal to 20% and less than or equal to 100%.

The crystalline semiconductor film 109 having a {110} crystal plane and containing silicon as its main component and also containing germanium and the metal element contains the metal element at a concentration over $1\times10^{19}/cm^3$; thus, conductivity is high.

Further, in the crystalline semiconductor film 109 having a {110} crystal plane and containing silicon as its main component and also containing germanium and the metal element, as well as the addition of germanium within a concentration range of greater than or equal to 0.1 at. % and less than or equal to 10 at. %, it is preferable that the concentrations of oxygen, nitrogen, and carbon in the film be each set at less than $1\times10^{19}/cm^3$, more preferably, the concentration of oxygen be set at less than $1\times10^{18}/cm^3$, and the concentrations of nitrogen and carbon be each set at less than $5\times10^{18}/cm^3$, and the film thickness be greater than or equal to 20 nm and less than or equal to 100 nm Consequently, in the crystalline semiconductor film 109 containing silicon as its main component and also containing germanium and the metal element, crystal growth in a direction parallel to the surface of the substrate 101 becomes dominant and the orientation ratio on {110} plane can be enhanced.

Figure 2A:
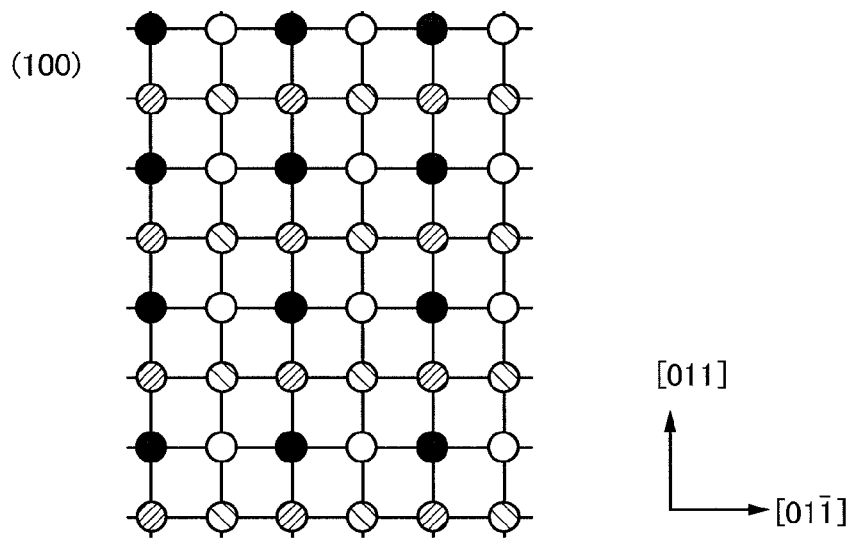
FIGS. 2A to 2C are diagrams illustrating a negative electrode of an energy storage device.
Figure 2B:
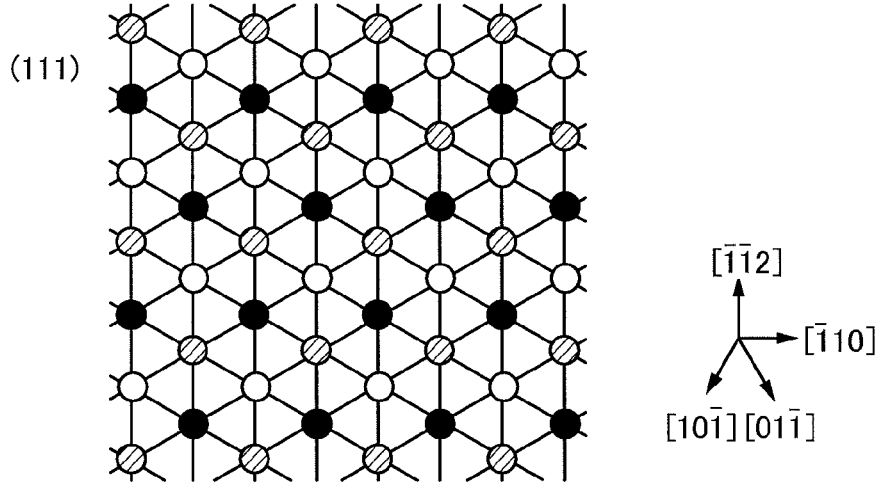
Figure 2C:
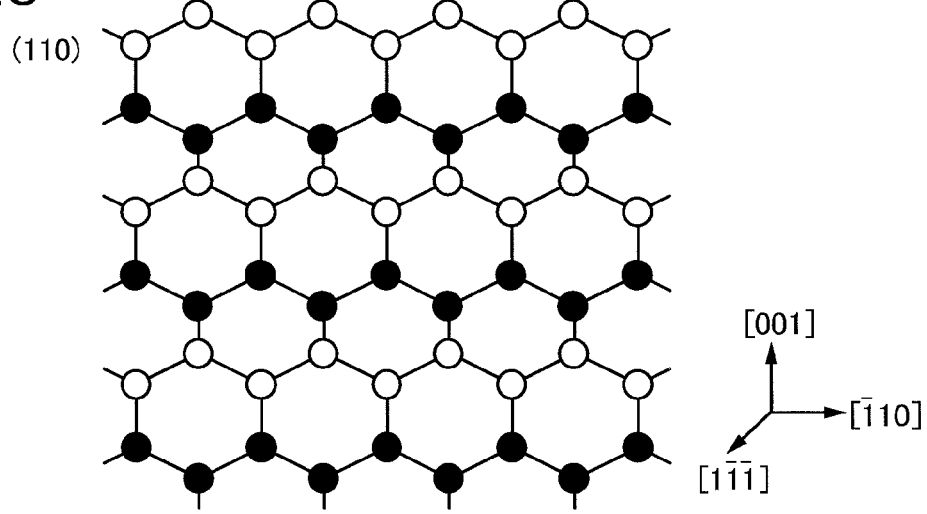

Here, FIGS. 2A to 2C show plane atomic arrangements of single crystal silicon when it is seen in a [100] direction, a [111] direction, and a [110] direction. FIG. 2A is an atomic arrangement of the single crystal silicon when it is seen in the [100] direction, and corresponds to a (100) plane. FIG. 2B is an atomic arrangement of the single crystal silicon when it is seen in [111] direction, and corresponds to a (111) plane. FIG. 2C is an atomic arrangement of the single crystal silicon when it is seen in [110] direction, and corresponds to a (110) plane. In each of the diagrams, a circle represents a silicon atom and a line connecting the circles represents an atomic bond. In FIGS. 2A to 2C, silicon atoms in the same atomic net plane, in atomic net planes which are perpendicular to the [100]

direction, the [111] direction, and the [110] direction, respectively, are represented by the same hatching.

When comparing with the (100) plane and the (111) plane in FIGS. 2A to 2C, a space between silicon atoms is larger in the (110) plane. Accordingly, by using a crystalline semiconductor film having a {110} crystal plane and at least containing silicon as its main component for an active material of the negative electrode, when lithium ions are injected into a negative electrode active material during charging to form lithium-silicon alloy and the volume is expanded, deterioration of the negative electrode due to the volume expansion can be reduced because a lattice space is large. Further, the number of lithium ions to be desorbed and the number of lithium ions to be injected are increased; thus discharge capacity can be increased.

Further, the crystalline semiconductor film 109 having a {110} crystal plane and containing silicon as its main component and also containing germanium and the metal element, includes the metal element at a concentration over $1 \times 10^{19}/cm^3$; thus, conductivity is high. Therefore, an oxidation-reduction reaction of the active material is promoted, and discharge capacity can be increased.

Next, a method for manufacturing the electrode (negative electrode) of the energy storage device shown in FIG. 1 is described with reference to FIGS. 3A to 3C.

Figure 3A:
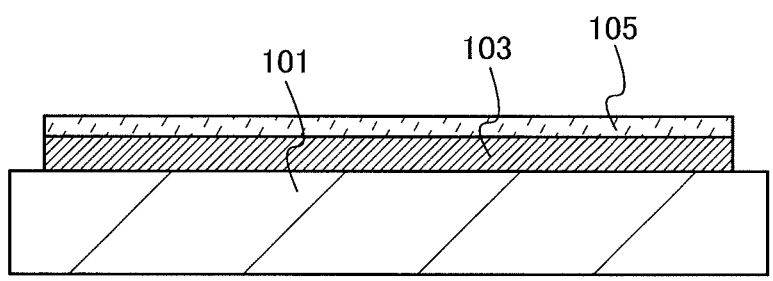
FIGS. 3A to 3C are cross-sectional views illustrating a method for manufacturing a negative electrode of an energy storage device.

As shown in FIG. 3A, the current collector 103 is formed over the substrate 101, and an amorphous semiconductor film 105 containing silicon as its main component and also containing germanium is formed over the current collector 103.

The current collector 103 can be formed by a sputtering method, an evaporation method, a printing method, an inkjet method, a CVD method, and the like as appropriate.

The amorphous semiconductor film 105 containing silicon as its main component and also containing germanium contains germanium within a concentration range of greater than or equal to 0.1 at. % and less than or equal to 10 at. % (preferably, greater than or equal to 1 at. % and less than or equal to 5 at. %). The content of germanium can be adjusted by a mixing ratio of $SiH_4$ and $GeH_4$ which are used as typical deposition gases. Further, the concentrations of nitrogen and carbon in the amorphous semiconductor film 105 are each less than $5 \times 10^{18}/cm^3$, and the concentration of oxygen in the amorphous semiconductor film 105 is less than $1 \times 10^{18}/cm^3$ so that adverse effects are not produced during the process of crystallization of the amorphous semiconductor film.

The amorphous semiconductor film 105 containing silicon as its main component and also containing germanium can be formed by a plasma CVD method, a low-pressure CVD method, or the like. Further, the amorphous semiconductor film 105 can be formed by a sputtering method using a target formed of silicon containing germanium. When the amorphous semiconductor film 105 is formed by a plasma CVD method, a low-pressure CVD method, or the like, a deposition gas containing silicon and a deposition gas containing germanium are introduced into a reaction chamber of a plasma CVD apparatus so that the concentration of germanium is greater than or equal to 0.1 at. % and less than or equal to 10 at. %, thereby forming the amorphous semiconductor film 105 by glow discharge decomposition using glow discharge plasma. Further, hydrogen and one or more of rare gases may be mixed in addition to the deposition gas containing silicon and the deposition gas containing germanium. As the rare gas, helium, neon, argon, krypton, or the like is given. Alternatively, the amorphous semiconductor film 105 may be formed by glow discharge decomposition using glow discharge plasma by introducing a deposition gas containing silicon and a deposition gas containing germanium diluted with hydrogen into a reaction chamber of a plasma CVD apparatus so that the concentration of germanium is greater than or equal to 0.1 at. % and less than or equal to 10 at. %.

As the deposition gas containing silicon, silicon hydride, silicon fluoride, or silicon chloride is given; typically, $SiH_4$, $Si_2H_6$, $SiF_4$, $SiCl_4$, $Si_2Cl_6$, or the like is given. As the deposition gas containing germanium, germanium hydride, germanium fluoride, or germanium chloride is given; typically, $GeH_4$, $Ge_2H_6$, $GeF_4$, $GeF_2$, $GeCl_4$, $GeCl_2$, or the like is given.

Next, a metal element which promotes crystallization of an amorphous semiconductor film is introduced into the amorphous semiconductor film 105 containing silicon as its main component and also containing germanium. As the metal element, one or more of metal elements which react with silicon to form a silicide is used. As the metal element which reacts with silicon to form a silicide, zirconium, titanium, hafnium, vanadium, niobium, tantalum, chromium, molybdenum, tungsten, cobalt, nickel, or platinum can be given. These metal elements can be used as a metal element which promotes crystallization of an amorphous semiconductor film in the invention described in this specification. The same quality and the same effect can be obtained when any of the metal elements is used; however, nickel is used as the metal element in this embodiment.

By introducing the metal element at a concentration over $1 \times 10^{19}/cm^3$ into the amorphous semiconductor film 105 containing silicon as its main component and also containing germanium, crystallinity of the crystalline semiconductor film containing silicon as its main component and also containing germanium can be enhanced in a subsequent crystallization process.

The above-described metal element is introduced into the entire surface of the amorphous semiconductor film 105 containing silicon as its main component and also containing germanium or a particular portion (in a linear, a lattice-like, or a point-like shape) on the surface of the amorphous semiconductor film 105.

As a method for introducing the above-described metal element into the amorphous semiconductor film 105 containing silicon as its main component and also containing germanium, a sputtering method, an evaporation method, a plasma process method (including a plasma CVD method), an adsorption method, a method of applying a solution of a metal salt, an inkjet method, a printing method, or the like can be used as appropriate. A metal element which is sputtered from a cathode in a glow discharge atmosphere of an inert gas is utilized in the plasma process method. Further, a method of applying a solution of a metal salt, a printing method, an inkjet method, or the like is easy to be performed; thus, such a method is useful in easily adjusting the concentration of the metal element. Note that the above-described metal element may be introduced into the amorphous semiconductor film 105 containing silicon as its main component and also containing germanium from the surface provided on the substrate 101 side or the surface which is on the opposite side of the substrate 101 side.

Various kinds of salts can be used as the metal salt, and water, organic solvents such as alcohols, aldehydes, or ether, or a mixture of water and these organic solvents can be used as a solvent. A solution in which such a metal salt is completely dissolved is not necessarily used, and a solution in which part of the metal salt or the whole metal salt is in a suspended form may be used.

When the metal element is introduced into the amorphous semiconductor film 105 containing silicon as its main component and also containing germanium by a method of applying a solution of a metal salt, a printing method, an inkjet method, or the like, an extremely thin oxide film is preferably formed on the surface of the amorphous semiconductor film 105 containing silicon as its main component and also containing germanium so that wettability of the solution of the metal salt on the surface thereof is improved. The oxide film can be formed by being exposed to an aqueous solution containing ozone.

Figure 3B:
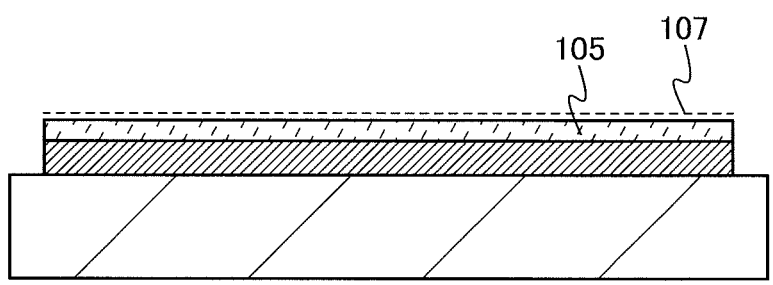

In this embodiment, after the extremely thin oxide film is formed on the surface of the amorphous semiconductor film 105 containing silicon as its main component and also containing germanium, a solution 107 of a metal salt is applied to the amorphous semiconductor film 105 containing silicon as its main component and also containing germanium as shown in FIG. 3B.

Figure 3C:
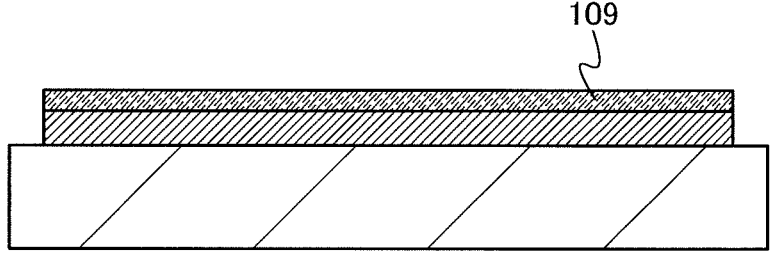

Next, the amorphous semiconductor film 105 containing silicon as its main component and also containing germanium is crystallized using the metal element, and the crystalline semiconductor film 109 having a {110} crystal plane and containing silicon as its main component and also containing germanium and the metal element can be formed as shown in FIG. 3C. The crystallization process is performed by heat treatment, or irradiation with intense light such as a laser beam, UV rays or infrared rays. Although the crystalline semiconductor film having {110} plane on a preferential basis and containing silicon as its main component and also containing germanium and the metal element can be formed by only heat treatment, crystal defects remaining in the crystal grains can be repaired and eliminated by performing irradiation with intense light such as a laser beam in addition to the heat treatment.

The heat treatment is preferably performed for 4 to 24 hours at greater than or equal to 450° C. and less than or equal to 750° C., more preferably, at 550° C. to 600° C. After that, in the case where irradiation with intense light such as a laser beam is performed, heat treatment is performed at 500° C. to 550° C. for 4 to 8 hours. The heat treatment can be performed in air or in a hydrogen atmosphere; however, the heat treatment is preferably performed in a nitrogen or inert gas atmosphere.

For the irradiation with a laser beam, an excimer laser with a wavelength of 400 nm or less or a second harmonic (with a wavelength of 532 nm) to a fourth harmonic (with a wavelength of 266 nm) of a YAG laser or a YVO$_4$ laser is used as a light source. The laser beam is collected into a linear or spot shape with an optical system and the film is scanned and irradiated with the laser beam. Instead of using the laser, irradiation with intense light may be performed using a halogen lamp, a xenon lamp, a mercury lamp, a metal halide lamp, or the like as a light source.

Note that hydrogen is made to be contained by hydrogenation treatment at greater than or equal to 0.01 and less than or equal to 1 at. % in the crystalline semiconductor film 109 having a {110} crystal plane and containing silicon as its main component and also containing germanium and the metal element; thus, defects remaining in the crystalline semiconductor film 109 having a {110} crystal plane and containing silicon as its main component and also containing germanium and the metal element can be effectively reduced. The hydrogenation treatment can be performed by heat treatment at 350° C. to 500° C. in an atmosphere containing hydrogen. Alternatively, hydrogenation can be performed by exposing the crystalline semiconductor film to plasma generated in an atmosphere containing hydrogen. Further, in the amorphous semiconductor film 105 containing silicon as its main component and also containing germanium, which is deposited using fluoride such as silicon fluoride or germanium fluoride, fluorine remains in the film at a concentration greater than or equal to 0.001 at. % and less than or equal to 1 at. % and compensates for the defects.

Through the above process, the crystalline semiconductor film having a {110} crystal plane and containing silicon as its main component and also containing germanium and the metal element can be formed.

Here, a mechanism for obtaining the crystalline semiconductor film having a {110} crystal plane and containing silicon as its main component and also containing germanium and the metal element is described.

First, crystallization of an amorphous silicon film, which is promoted by the metal element, is described.

By heat treatment at 400° C. to 500° C., the metal element and silicon in the amorphous silicon react with each other; accordingly, a silicide is formed. The silicide serves as a crystal nucleus and contributes to the subsequent crystal growth. For example, when nickel is used as a typical metal element, nickel silicide (hereinafter referred to as NiSi$_2$) is formed. A nickel atom has a higher degree of solubility in amorphous silicon than in crystal silicon, thereby moving to the amorphous silicon side.

NiSi$_2$ has a fluorite structure, in which a nickel atom is arranged between silicon lattices having a diamond structure and in the case where the nickel atom disappears from NiSi$_2$, a crystal structure of silicon remains. The structure of NiSi$_2$ is similar to the diamond structure; specifically, the structure on (111) plane of NiSi$_2$ is similar to the structure on (111) plane of diamond structure. Therefore, it can be said that the interface between NiSi$_2$ and silicon in the diamond structure is in an aligned state (that is, in the state where interface energy is small).

NiSi$_2$ does not have particular orientation; however, when the amorphous semiconductor film has a thickness of greater than or equal to 20 nm and less than or equal to 100 nm, crystals mainly grow in a direction parallel to a substrate surface. In that case, interface energy at the interface between NiSi$_2$ and the (111) plane of crystal silicon is the smallest; thus, crystals are arranged on (111) plane on a preferential basis in the plane perpendicular to a direction of the crystal growth direction (that is, the direction parallel to the substrate plane). As a result, the plane parallel to the surface of the crystalline silicon film is the (110) plane and crystals are arranged on the (110) plane on a preferential basis. Note that in the case where crystal grows in the direction parallel to the substrate surface and the crystal grows in a columnar shape, flexibility exists in a rotation direction with the column crystal as an axis; thus, crystals are not always arranged on the (110) plane and crystals may be arranged on other planes.

Next, crystallization of the amorphous semiconductor film containing silicon as its main component and also containing germanium, which is promoted by the metal element, is described. In the amorphous semiconductor film containing silicon as its main component and also containing germanium, when NiSi$_2$ that is a crystal nucleus is formed, germanium is hardly solid-dissolved in NiSi$_2$ because of difference in an interatomic distance; thus, NiSi$_2$ that is a crystal nucleus is formed while removing germanium in the amorphous semiconductor film to the periphery. Therefore, germanium is segregated to the outside of the column crystal. Because germanium having a large atomic radius exists only in the surrounding amorphous semiconductor when it is seen from NiSi$_2$, generation of large distortion (tensile stress) is expected. Due to this distortion energy, a distance between adjacent crystal nuclei is increased and the density of the crystal nuclei is decreased. In other words, the distortion energy renders the critical radius in nucleus generation large. Further, it is assumed that this distortion (tensile stress) has effects of imposing limit on crystal orientation of the crystal nuclei of $NiSi_2$ and increasing orientation ratio on a particular crystal plane (specifically, (110) plane).

After that, an amorphous silicon film is formed over the crystalline semiconductor film 109 having a {110} crystal plane and containing silicon as its main component and also containing germanium and the metal element, and then heat treatment is performed, whereby the amorphous silicon film is solid-phase grown (solid-phase epitaxially grown) using the crystalline semiconductor film 109 having a {110} crystal plane and containing silicon as its main component and also containing germanium and the metal element as a seed crystal. Thus, a crystalline silicon film having a {110} crystal plane and containing the metal element can be formed and the thickness of the active material of the negative electrode can be increased.

Alternatively, a semiconductor film is deposited on the crystalline semiconductor film 109 having a {110} crystal plane and containing silicon as its main component and also containing germanium and the metal element by a plasma CVD method using a deposition condition for a microcrystal silicon film or a crystalline silicon film, whereby the semiconductor film is vapor-phase grown (vapor-phase epitaxially grown) using the crystalline semiconductor film 109 having a {110} crystal plane and containing silicon as its main component and also containing germanium and the metal element as a seed crystal. Thus, a crystalline silicon film having a {110} crystal plane can be formed and the thickness of the active material of the negative electrode can be increased. The deposition condition for the microcrystal silicon film or the crystalline silicon film is that a dilution ratio of hydrogen to the deposition gas containing silicon is high; typically, the deposition gas containing silicon is diluted with hydrogen with a flow rate of 10 to 200 times as high as that of the deposition gas containing silicon.

Through the above manufacturing steps, the electrode of the energy storage device shown in FIG. 1 can be manufactured.

Next, a method for manufacturing the electrode of the energy storage device, which is different from that shown in FIGS. 3A to 3C is described with reference to FIGS. 4A to 4C.

Figure 4A:
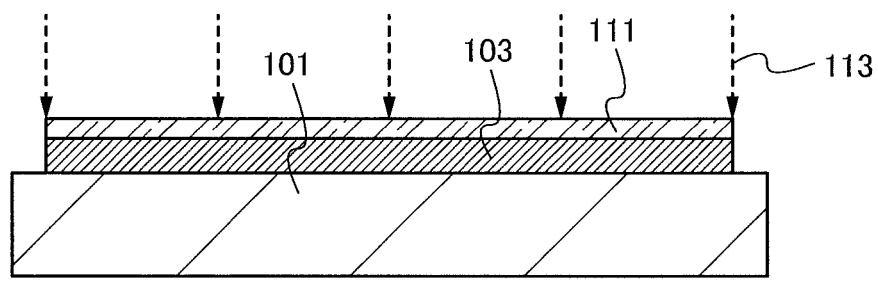
FIGS. 4A to 4C are cross-sectional views illustrating a method for manufacturing a negative electrode of an energy storage device.

As illustrated in FIG. 4A, the current collector 103 is formed over the substrate 101.

Next, an amorphous silicon film 111 is formed over the current collector 103. The amorphous silicon film 111 can be formed by a plasma CVD method, a low-pressure CVD method, or a sputtering method by using a target formed of silicon.

When the amorphous silicon film 111 is formed by a plasma CVD method or a low-pressure CVD method, the amorphous silicon film 111 is formed by glow discharge decomposition using glow discharge plasma by introducing a deposition gas containing silicon into a reaction chamber of a plasma CVD apparatus. Further, hydrogen and one or more of rare gases may be mixed in addition to the deposition gas containing silicon.

Next, a germanium ion 113 is added to the amorphous silicon film 111. As a method for adding the germanium ion, an ion implantation method or an ion doping method can be used. The germanium ion is obtained by decomposition of germane; thus, a germanium ion obtained by decomposition of germane is added to the amorphous silicon film 111. The amount of germanium to be added is greater than or equal to 0.1 at. % and less than or equal to 10 at. %. The amount of germanium to be added can be controlled accurately by controlling acceleration voltage and dosage of ions in the ion implantation method or the ion doping method.

Figure 4B:
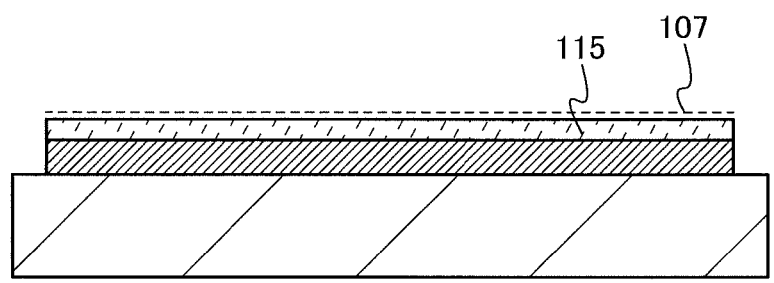

As a result, as shown in FIG. 4B, the amorphous semiconductor film 115 containing silicon as its main component and also containing germanium can be formed over the current collector 103.

Next, a metal element which promotes crystallization of the amorphous semiconductor film is introduced into the amorphous semiconductor film 115 containing silicon as its main component and also containing germanium. In this embodiment, the solution 107 of a metal salt is applied to the amorphous semiconductor film 105 containing silicon as its main component and also containing germanium as shown in FIG. 4B.

Figure 4C:
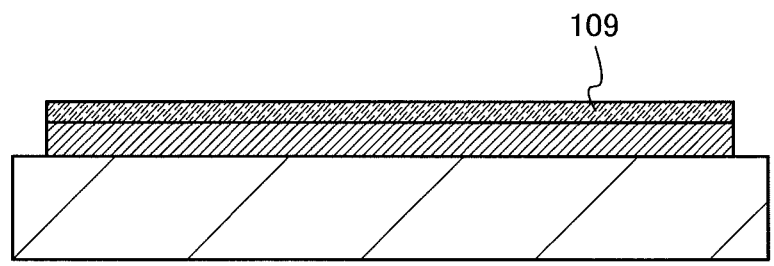

Next, the amorphous semiconductor film 115 containing silicon as its main component and also containing germanium is crystallized using the metal element, and the crystalline semiconductor film 109 having a {110} crystal plane and containing silicon as its main component and also containing germanium and the metal element can be formed as shown in FIG. 4C.

After that, an amorphous silicon film is formed over the crystalline semiconductor film 109 having a {110} crystal plane and containing silicon as its main component and also containing germanium and the metal element, and then heat treatment is performed, whereby the amorphous silicon film is solid-phase grown (solid-phase epitaxially grown) using the crystalline semiconductor film 109 having a {110} crystal plane and containing silicon as its main component and also containing germanium and the metal element as a seed crystal. Thus, a crystalline silicon film having a {110} crystal plane and containing the metal element can be formed and the thickness of the active material of the negative electrode can be increased.

Alternatively, a semiconductor film is deposited on the crystalline semiconductor film 109 having a {110} crystal plane and containing silicon as its main component and also containing germanium and the metal element by a plasma CVD method using a deposition condition for a microcrystal silicon film or a crystalline silicon film, whereby the semiconductor film is vapor-phase grown (vapor-phase epitaxially grown) using the crystalline semiconductor film 109 having a {110} crystal plane and containing silicon as its main component and also containing germanium and the metal element as a seed crystal. Thus, a crystalline silicon film having a {110} crystal plane can be formed and the thickness of the active material of the negative electrode can be increased. The deposition condition for the microcrystal silicon film or the crystalline silicon film is that a dilution ratio of hydrogen to the deposition gas containing silicon is high; typically, the deposition gas containing silicon is diluted with hydrogen with a flow rate of 10 to 200 times as high as that of the deposition gas containing silicon.

Through the above manufacturing steps, the electrode of the energy storage device shown in FIG. 1 can be manufactured.

Embodiment 2

One embodiment of an electrode for an energy storage device of this embodiment is described with reference to FIGS. 5A and 5B.

Figure 5A:
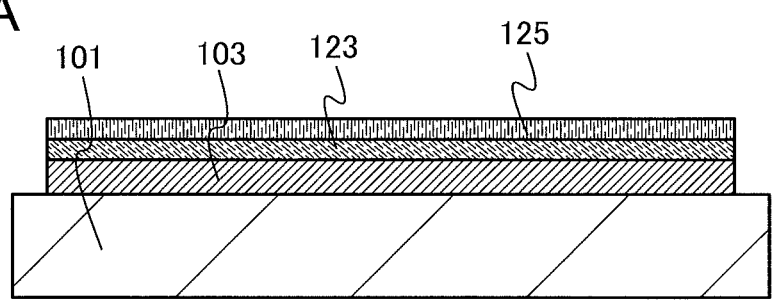
FIGS. 5A and 5B are cross-sectional views illustrating a negative electrode of an energy storage device.

FIG. 5A illustrates one embodiment of the electrode (negative electrode) of the energy storage device. The electrode includes the current collector 103, a crystalline semiconductor film 123 containing silicon as its main component and also containing germanium, which is provided on one surface of the current collector 103, and a crystalline silicon film 125 having a {110} crystal plane, which is provided over the crystalline semiconductor film 123 containing silicon as its main component and also containing germanium. Here, the crystalline semiconductor film 123 containing silicon as its main component and also containing germanium, and the crystalline silicon film 125 having a {110} crystal plane serve as active materials. Note that the current collector 103 is formed over the substrate 101.

The concentration range of germanium in the crystalline semiconductor film 123 containing silicon as its main component and also containing germanium is preferably greater than or equal to 0.1 at. % and less than or equal to 10 at. %. Further, in the crystalline silicon film 125 having a {110} crystal plane, the orientation ratio on the {110} plane is preferably high. Typically, the orientation ratio on the {110} plane is preferably greater than or equal to 20% and less than or equal to 100%.

Further, in the crystalline semiconductor film 123 containing silicon as its main component and also containing germanium, as well as the addition of germanium within a concentration range of greater than or equal to 0.1 at. % and less than or equal to 10 at. %, it is preferable that the concentrations of oxygen, nitrogen, and carbon in the film be each set at less than $1\times10^{19}/cm^3$, more preferably, the concentration of oxygen be set at less than $1\times10^{18}/cm^3$ and the concentrations of nitrogen and carbon be each set at less than $5\times10^{18}/cm^3$.

The thickness of the crystalline semiconductor film 123 containing silicon as its main component and also containing germanium is preferably smaller than the crystalline silicon film 125 having a {110} crystal plane. Typically, the crystalline semiconductor film 123 containing silicon as its main component and also containing germanium is formed to a thickness of greater than or equal to 5 nm and less than or equal to 30 nm, and the crystalline silicon film 125 having a {110} crystal plane, which is formed over the crystalline semiconductor film 123, is formed to a thickness of greater than or equal to 15 nm and less than or equal to 70 nm. The crystalline semiconductor film 123 containing silicon as its main component and also containing germanium contains germanium having a larger atomic radius than silicon and can reduce generation density of crystal nuclei. The crystalline semiconductor film 123 containing silicon as its main component and also containing germanium is desirably formed thinner than the crystalline silicon film 125 having a {110} crystal plane because it is used as a seed crystal to improve orientation on a particular crystal plane in a formation process of the crystalline silicon film 125 having a {110} crystal plane.

By using, as the active material of the negative electrode, a stack of the crystalline semiconductor film 123 containing silicon as its main component and also containing germanium and the crystalline silicon film 125 having a {110} crystal plane, deterioration of the negative electrode due to charge and discharge can be reduced and discharge capacity can be increased.

Next, another embodiment of the electrode for the energy storage device of this embodiment is described with reference to FIG. 5B.

Figure 5B:
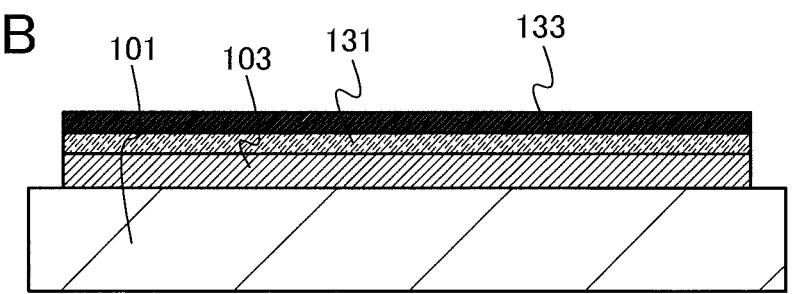

FIG. 5B illustrates one embodiment of the electrode (negative electrode) of the energy storage device. The electrode includes the current collector 103, a crystalline semiconductor film 131 having a {110} crystal plane and containing silicon as its main component and also containing germanium and a metal element, which is provided on one surface of the current collector 103, and a crystalline silicon film 133 having a {110} crystal plane and containing a metal element, which is provided over the crystalline semiconductor film 131 having a {110} crystal plane and containing silicon as its main component and also containing germanium and a metal element. Here, the crystalline semiconductor film 131 having a {110} crystal plane and containing silicon as its main component and also containing germanium and the metal element, and the crystalline silicon film 133 having a {110} crystal plane and containing the metal element serve as active materials. Note that the current collector 103 is formed over the substrate 101. In the crystalline semiconductor film 131 having a {110} crystal plane and containing silicon as its main component and also containing germanium and the metal element, the crystalline silicon film having a {110} crystal plane, and the crystalline silicon film 133 having a {110} crystal plane and containing the metal element, the orientation ratio on the {110} plane is preferably high. Typically, the orientation ratio on the {110} plane is preferably greater than or equal to 20% and less than or equal to 100%.

The crystalline semiconductor film 131 having a {110} crystal plane and containing silicon as its main component and also containing germanium and the metal element is similar to the crystalline semiconductor film 109 having a {110} crystal plane and containing silicon as its main component and also containing germanium and the metal element, which is described in Embodiment 1.

The crystalline semiconductor film 133 having a {110} crystal plane and containing the metal element includes the metal element at a concentration over $1\times10^{19}/cm^3$; thus, conductivity is high.

By using as the active material of the negative electrode, a stack of the crystalline semiconductor film 131 having a {110} crystal plane and containing silicon as its main component and also containing germanium and the metal element, and the crystalline silicon film 133 having a {110} crystal plane and containing the metal element, deterioration of the negative electrode due to charge and discharge can be reduced and discharge capacity can be increased.

Next, a method for manufacturing the electrode of the energy storage device shown in FIG. 5A is described with reference to FIGS. 6A to 6C.

Figure 6A:
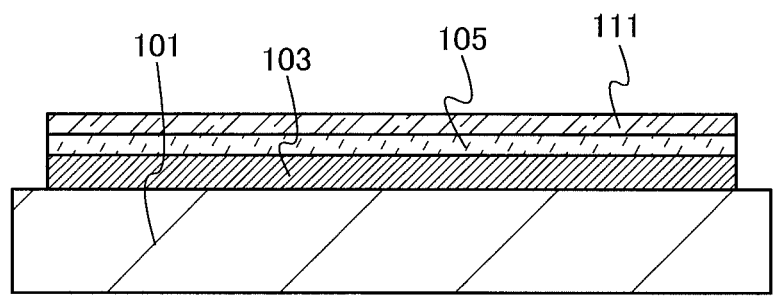
FIGS. 6A to 6C are cross-sectional views illustrating a method for manufacturing a negative electrode of an energy storage device.

As shown in FIG. 6A, the current collector 103 is formed over the substrate 101. The current collector 103 in this embodiment is formed using the material for the current collector 103 described in Embodiment 1 as appropriate. Note that the current collector 103 may have a foil shape, a plate shape, or a net shape.

Next, the amorphous semiconductor film 105 containing silicon as its main component and also containing germanium is formed over the current collector 103. Then, the amorphous silicon film 111 is formed over the amorphous semiconductor film 105 containing silicon as its main component and also containing germanium. The thickness of the amorphous semiconductor film 105 containing silicon as its main component and also containing germanium is preferably half or less than half the thickness of the amorphous silicon film 111, and the total thickness of the stacked amorphous semiconductor film 105 containing silicon as its main component and also containing germanium and the amorphous silicon film 111 is desirably greater than or equal to 20 nm and less than or equal to 100 nm (more preferably, greater than or equal to 30 nm and less than or equal to 60 nm).

The amorphous semiconductor film 105 containing silicon as its main component and also containing germanium and the amorphous silicon film 111 are preferably formed successively without being exposed to the atmosphere in order to prevent contamination.

Figure 6B:
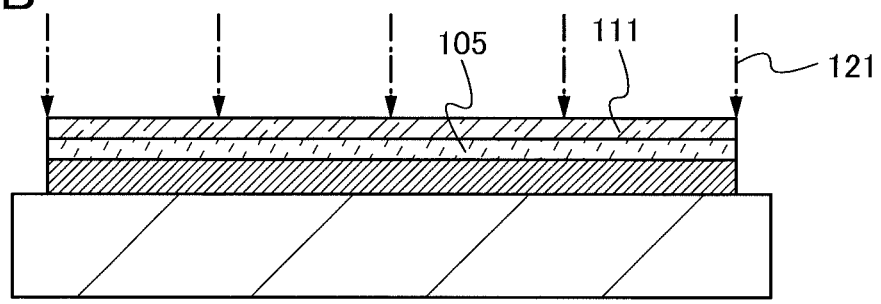
Figure 6C:
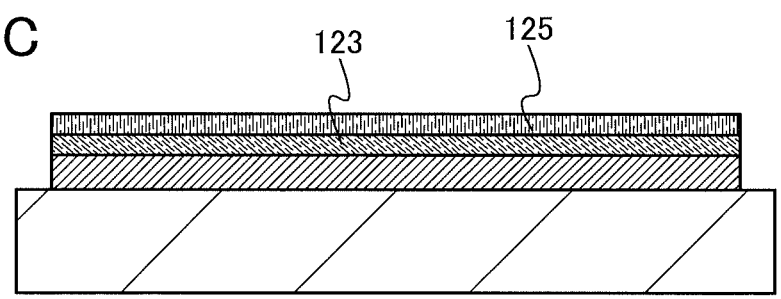

Next, as shown in FIG. 6B, the amorphous silicon film 111 is irradiated with a laser beam 121. Consequently, the amorphous semiconductor film 105 containing silicon as its main component and also containing germanium and the amorphous silicon film 111 are crystallized, thereby forming the crystalline semiconductor film 123 containing silicon as its main component and also containing germanium and the crystalline silicon film 125 having a {110} crystal plane as shown in FIG. 6C.

For the irradiation with the laser beam, an excimer laser with a wavelength of 400 nm or less or a second harmonic (with a wavelength of 532 nm) to a fourth harmonic (with a wavelength of 266 nm) of a YAG laser or a YVO$_4$ laser is used as a light source. The laser beam is collected into a linear or spot shape with an optical system and irradiation is performed. A predetermined region of the substrate is processed by being scanned with the laser beam collected as described above. Although a mode in which irradiation is performed only from the surface side of the amorphous silicon film 111 is described in FIG. 6B, irradiation may be performed from both sides. Instead of using the laser beam, irradiation with intense light may be performed using a halogen lamp, a xenon lamp, a mercury lamp, a metal halide lamp, or the like as a light source. Alternatively, after irradiating the amorphous silicon film 111 with the laser beam, irradiation with intense light may be performed using a halogen lamp, a xenon lamp, a mercury lamp, a metal halide lamp, or the like.

Note that before performing the irradiation with the above-mentioned laser beam, hydrogen contained in the amorphous semiconductor film 105 containing silicon as its main component and also containing germanium and in the amorphous silicon film 111 is preferably discharged. When heat treatment is performed at 400° C. to 500° C. for approximately 1 hour so that the amount of hydrogen contained in the films is less than or equal to 5 at. % and the films are then irradiated with the laser beam to be crystallized, surface roughness of the crystalline silicon film 125 having a {110} crystal plane can be prevented.

Here, a mechanism for forming the crystalline semiconductor film having a {110} crystal plane by the irradiation with the laser beam is described.

When the amorphous silicon film to be irradiated with the laser beam is a single layer, heat in melted liquid-phase silicon is diffused into the current collector 103 during the solid-phase reaction after the irradiation with the laser beam. Thus, the liquid-phase silicon is cooled from the interface with the current collector 103 and solid-phase reaction proceeds; accordingly, the amorphous silicon film is crystallized. Therefore, crystals grow in a direction perpendicular to the surface of the film.

On the other hand, in the case where the silicon film irradiated with the laser beam is formed over the amorphous semiconductor film 105 containing silicon as its main component and also containing germanium as illustrated in this embodiment, because the melting point of germanium is 937° C., which is lower than the melting point of silicon, 1415° C., temperatures at which the solid-phase reaction start are different to some extent between the amorphous semiconductor film 105 and the amorphous silicon film 111, and the solid-phase reaction of the amorphous silicon film 111 starts at a higher temperature. Therefore, when the amorphous silicon film 111 partially starts the solid-phase reaction, the amorphous semiconductor film 105 containing silicon as its main component and also containing germanium is kept in the melted liquid-phase state for a while. Thus, the crystallized crystalline silicon film 125 is not affected by the current collector 103 formed over the substrate. Further, it can be considered that in the process of the solid-phase reaction after the irradiation with the laser beam, the melted liquid-phase silicon in the amorphous silicon film 111 is excessively cooled in the vicinity of the interface with the amorphous semiconductor film 105 containing silicon as its main component and also containing germanium in the melted liquid-phase state. As a result, the crystalline silicon film having a {110} crystal plane can be formed.

After that, an amorphous silicon film is formed over the crystalline silicon film 125 having a {110} crystal plane, and heat treatment is performed, whereby the amorphous silicon film is solid-phase grown (solid-phase epitaxially grown) using the crystalline silicon film having a {110} crystal plane as a seed crystal. Thus, a crystalline silicon film having a {110} crystal plane can be formed and the thickness of the active material of the negative electrode can be increased.

Alternatively, a semiconductor film is deposited on the crystalline silicon film 125 having a {110} crystal plane by a plasma CVD method using a deposition condition for a microcrystal silicon film or a crystalline silicon film, whereby the semiconductor film is vapor-phase grown (vapor-phase epitaxially grown) using the crystalline silicon film 125 having a {110} crystal plane as a seed crystal. Thus, a crystalline silicon film having a {110} crystal plane can be formed and the thickness of the active material of the negative electrode can be increased. The deposition condition for the microcrystal silicon film or the crystalline silicon film is that a dilution ratio of hydrogen to the deposition gas containing silicon is high; typically, the deposition gas containing silicon is diluted with hydrogen with a flow rate of 10 to 200 times as high as that of the deposition gas containing silicon.

Next, a method for manufacturing the electrode of the energy storage device shown in FIG. 5B is described with reference to FIGS. 7A to 7C.

Figure 7A:
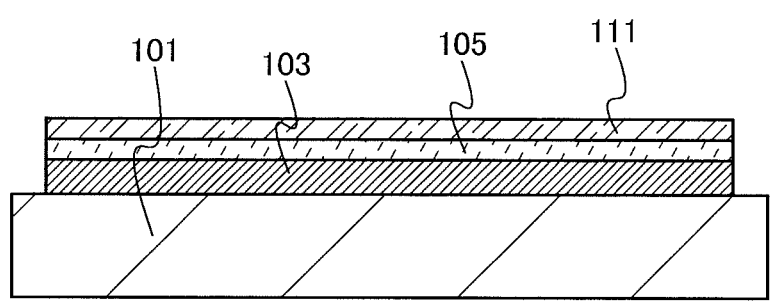
FIGS. 7A to 7C are cross-sectional views illustrating a method for manufacturing a negative electrode of an energy storage device.

As shown in FIG. 7A, the current collector 103 is formed over the substrate 101. The current collector 103 in this embodiment is formed using the manufacturing method similar to that illustrated in Embodiment 1 as appropriate. Note that the current collector 103 may have a foil shape, a plate shape, or a net shape.

Next, the amorphous semiconductor film 105 containing silicon as its main component and also containing germanium is formed over the current collector 103. Then, the amorphous silicon film 111 is formed over the amorphous semiconductor film 105 containing silicon as its main component and also containing germanium.

Figure 7B:
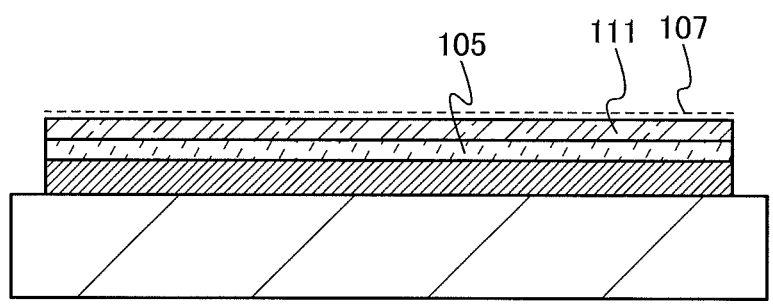

Next, as shown in FIG. 7B, a metal element which promotes crystallization of the amorphous semiconductor film is introduced into the amorphous semiconductor film 105 containing silicon as its main component and also containing germanium and the amorphous silicon film 111 as in Embodiment 1. Here, the solution 107 of a metal salt is applied to the amorphous semiconductor film 111.

Next, before the heat treatment for the crystallization, dehydrogenation treatment for discharging hydrogen contained in the amorphous semiconductor film 105 containing silicon as its main component and also containing germanium and the amorphous silicon film 111 is performed. The dehydrogenation treatment is performed at 400° C. to 500° C. for 0.5 to 5 hours, typically, at 500° C. for 1 hour.

Next, by conducting crystallization process as in Embodiment 1, the metal element is diffused into the amorphous semiconductor film 105 containing silicon as its main component and also containing germanium and into the amorphous silicon film 111 and a crystal nucleus is formed, and at the same time, crystallization of the amorphous semiconductor film 105 containing silicon as its main component and also containing germanium and the amorphous silicon film 111 is performed. The crystallization process is performed by heat treatment, or irradiation with intense light such as a laser beam, UV rays or infrared rays. Although the crystalline silicon film in which {110} plane is arranged on a preferential basis can be obtained only by the heat treatment, a method is preferably employed in which heat treatment is performed and then irradiation with intense light such as a laser beam, UV rays or infrared rays is performed. The laser treatment after the heat treatment can allow crystal defects remaining in the crystal grains to be repaired and eliminated.

Figure 7C:
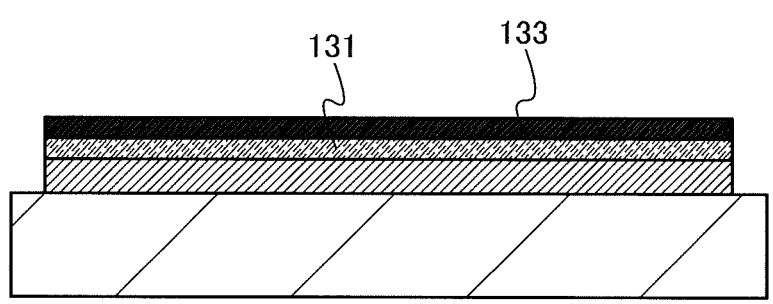

Consequently, as illustrated in FIG. 7C, the crystalline semiconductor film 131 having a {110} crystal plane and containing silicon as its main component and also containing germanium and the metal element and the crystalline silicon film 133 having a {110} crystal plane and containing the metal element can be formed.

As the metal element which promotes crystallization of silicon, which is introduced into the amorphous semiconductor film 105 containing silicon as its main component and also containing germanium and into the amorphous silicon film 111, a metal element which reacts with silicon to form a siliside can be used. The silicide serves as a crystal nucleus and contributes to the subsequent crystal growth.

Further, it can be considered that the diffusion rate of nickel in the amorphous semiconductor film is higher when germanium is included in the film. Thus, it can be considered that crystal growth by $NiSi_2$ is faster in the amorphous semiconductor film 105 containing silicon as its main component and also containing germanium.

Accordingly, the amorphous semiconductor film 105 containing silicon as its main component and also containing germanium is crystallized by the heat treatment and becomes the crystalline semiconductor film 131 having a {110} crystal plane and containing silicon as its main component and also containing germanium and the metal element. With the crystallization, epitaxial growth of the amorphous silicon film 111 occurs using the crystalline semiconductor film 131 having a {110} crystal plane and containing silicon as its main component and also containing germanium and the metal element as a seed crystal, thereby forming the crystalline silicon film 133 having a {110} crystal plane and containing the metal element.

After that, an amorphous silicon film is formed over the crystalline silicon film 133 having a {110} crystal plane and containing the metal element, and heat treatment is performed, whereby the amorphous silicon film is solid-phase grown (solid-phase epitaxially grown) using the crystalline silicon film 133 having a {110} crystal plane and containing the metal element as a seed crystal. Thus, a crystalline silicon film having a {110} crystal plane and containing the metal element can be formed and the thickness of the active material of the negative electrode can be increased.

Alternatively, a semiconductor film is deposited on the crystalline silicon film 133 having a {110} crystal plane and containing the metal element by a plasma CVD method using a deposition condition for a microcrystal silicon film or a crystalline silicon film, whereby the semiconductor film is vapor-phase grown (vapor-phase epitaxially grown) using the crystalline silicon film 133 having a {110} crystal plane and containing the metal element as a seed crystal. Thus, a crystalline silicon film having a {110} crystal plane can be formed and the thickness of the active material of the negative electrode can be increased. The deposition condition for the microcrystal silicon film or the crystalline silicon film is that a dilution ratio of hydrogen to the deposition gas containing silicon is made higher; typically, the deposition gas containing silicon is diluted with hydrogen with a flow rate of 10 to 200 times as high as that of the deposition gas containing silicon.

Through the above manufacturing steps, the electrode of the energy storage device shown in FIG. 5B can be manufactured.

Embodiment 3

In this embodiment, a structure of the energy storage device is described with reference to FIG. 8.

First, a structure of a secondary battery is described below as an energy storage device.

Among secondary batteries, a lithium ion battery formed using a lithium-containing metal oxide as a positive electrode active material such as $LiCoO_2$, has high capacity and high safety. Here, the structure of a lithium ion battery, which is a typical example of the secondary battery, is described.

Figure 8:
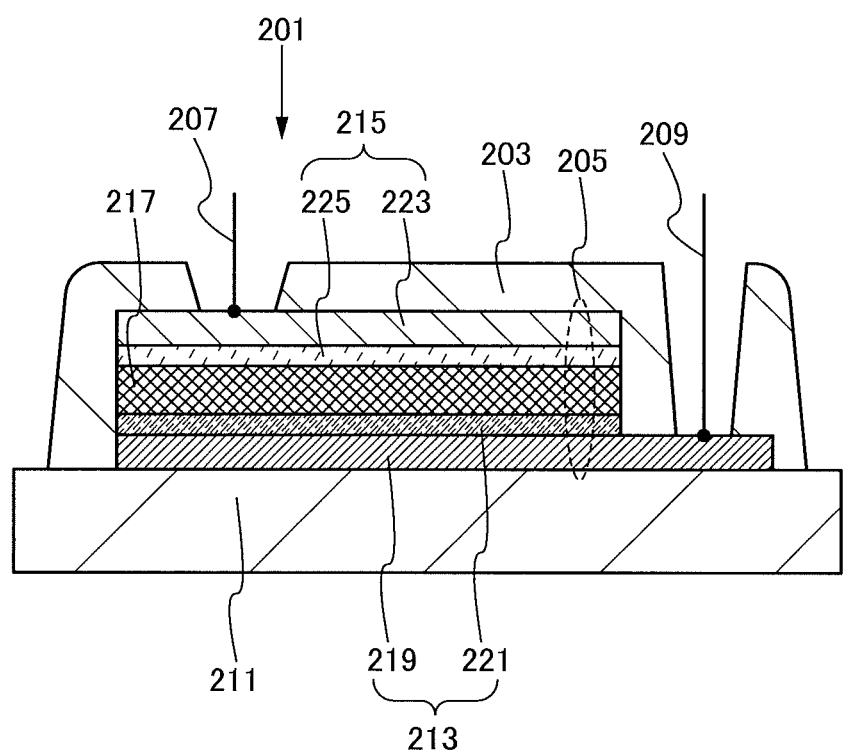
FIG. 8 is a cross sectional view illustrating one embodiment of an energy storage device.

FIG. 8 is a cross-sectional view of an energy storage device 201.

The energy storage device 201 illustrated in FIG. 8 includes an energy storage cell 205 in a protection member 203. The energy storage device 201 further includes terminal portions 207 and 209 which are connected to the energy storage cell 205. For the protection member 203, an organic resin such as an epoxy resin or a fluoride resin can be used.

As illustrated in FIG. 8, the energy storage cell 205 includes a negative electrode 213, a positive electrode 215, and an electrolyte 217 provided between the negative electrode and the positive electrode over a substrate 211. The negative electrode 213 includes a negative electrode current collector 219 and a negative electrode active material 221. Further, the positive electrode 215 includes a positive electrode current collector 223 and a positive electrode active material 225.

The negative electrode current collector 219 is connected to the terminal portion 209 in an opening portion of the protection member 203. The positive electrode current collector 223 is connected to the terminal portion 207 in an opening portion of the protection member 203.

Note that although an energy storage device having a structure in which the energy storage cell 205 is provided over the substrate 211 is described as the energy storage device 201 in this embodiment, a storage device can have a variety of structures; for example, a thin energy storage device which is sealed as appropriate, a button energy storage device, a cylindrical energy storage device, or a rectangular storage device can be used.

As the negative electrode current collector 219, the current collector described in Embodiment 1 and Embodiment 2 can be used.

As the negative electrode active material 221, the active material described in Embodiment 1 and Embodiment 2 can be used. Note that the negative electrode active material 221 may be predoped with lithium. A lithium film on the surface of the negative electrode active material 221 is formed by a sputtering method, whereby the negative electrode active material 221 can be predoped with lithium. Alternatively, lithium foil is provided on the surface of the negative electrode active material 221, whereby the negative electrode active material 221 can be predoped with lithium.

Aluminum, stainless steel, or the like is used for the positive electrode current collector 223. The positive electrode current collector 223 can have a foil shape, a plate shape, a net shape, or the like as appropriate.

As the positive electrode active material 225, $LiFeO_2$, $LiCoO_2$, $LiMn_2O_4$, $LiFe(II)PO_4$, $LiCoPO_4$, $LiNiPO_4$, $LiMn_2PO_4$, $V_2O_5$, $Cr_2O_5$, $MnO_2$, or other materials can be used.

Here, as the electrolyte 217, a solid electrolyte such as $Li_3PO_4$, LiPON or, $LiFe(III)PO_4$, is used.

Note that in the case where a liquid electrolyte is used as the electrolyte 217, as the solute of the electrolyte 217, a material which can transfer lithium ions and in which lithium ions stably exist is used. Typical examples of the solute of the electrolyte include lithium salt such as $LiClO_4$, $LiAsF_6$, $LiBF_4$, $LiPF_6$, and $Li(C_2F_5SO_2)_2N$. As the solvent of the electrolyte 217, a material which can transfer lithium ions is used. As the solvent of the electrolyte 217, an aprotic organic solvent is preferably used. Typical examples of aprotic organic solvents include ethylene carbonate, propylene carbonate, dimethyl carbonate, diethyl carbonate, γ-butyrolactone, acetonitrile, dimethoxyethane, tetrahydrofuran, and the like, and one or more of these materials can be used. When a gelled polymer is used as the solvent of the electrolyte 217, safety against liquid leakage or the like is increased and the energy storage device 201 can be thin and lightweight. Typical examples of gelled polymers include a silicon gel, an acrylic gel, an acrylonitrile gel, polyethylene oxide, polypropylene oxide, a fluorine-based polymer, and the like.

Note that in the case where the liquid electrolyte is used as the electrolyte 217, a separator is preferably used between the negative electrode 213 and the positive electrode 215.

An insulating porous material is used for the separator. Typical examples of the separator include cellulose (paper), polyethylene, and polypropylene The lithium ion battery has a small memory effect, high energy density, high capacity, and high drive voltage. Thus, the size and weight of the lithium ion battery can be reduced. Further, the lithium ion battery do not easily degrade due to repetitive charge and discharge and can be used for a long time, so that cost can be reduced.

Second, a capacitor is described as an energy storage device. Typical examples of capacitors include a double-layer capacitor, a lithium ion capacitor, and the like.

In the case of a capacitor, as the positive electrode active material 225 in the secondary battery in FIG. 8, a material capable of reversibly adsorbing and desorbing lithium ions and/or anions is preferably used. Typical examples of the positive electrode active material 225 include active carbon, a conductive polymer, and a polyacene organic semiconductor (PAS).

The lithium ion capacitor has high efficiency of charge and discharge, capability of rapid charge and discharge, and a long life to withstand repeated use. The display panel has high writing voltage and do not need power after writing of data; thus, it is preferable to use a lithium ion capacitor capable of rapid charge and discharge.

With the negative electrode described in Embodiment 1 and Embodiment 2, an energy storage device with high durability in which deterioration of charge-discharge cycle characteristics is suppressed can be manufactured.

Embodiment 4

In this embodiment, an application example of an energy storage device described in Embodiment 3 is described with reference to FIG. 9.

The energy storage device described in Embodiment 3 can be used in electronic devices such as cameras such as digital cameras or video cameras, mobile phones (also referred to as cellular phones or cellular phone devices), digital photo frames, portable game machines, portable information terminals, and audio reproducing devices. Further, the energy storage device can be used in electric propulsion vehicles such as electric vehicles, hybrid vehicles, train vehicles, maintenance vehicles, carts, wheelchairs, and bicycles. Here, as a typical example of the electric propulsion vehicles, a wheelchair is described.

Figure 9:
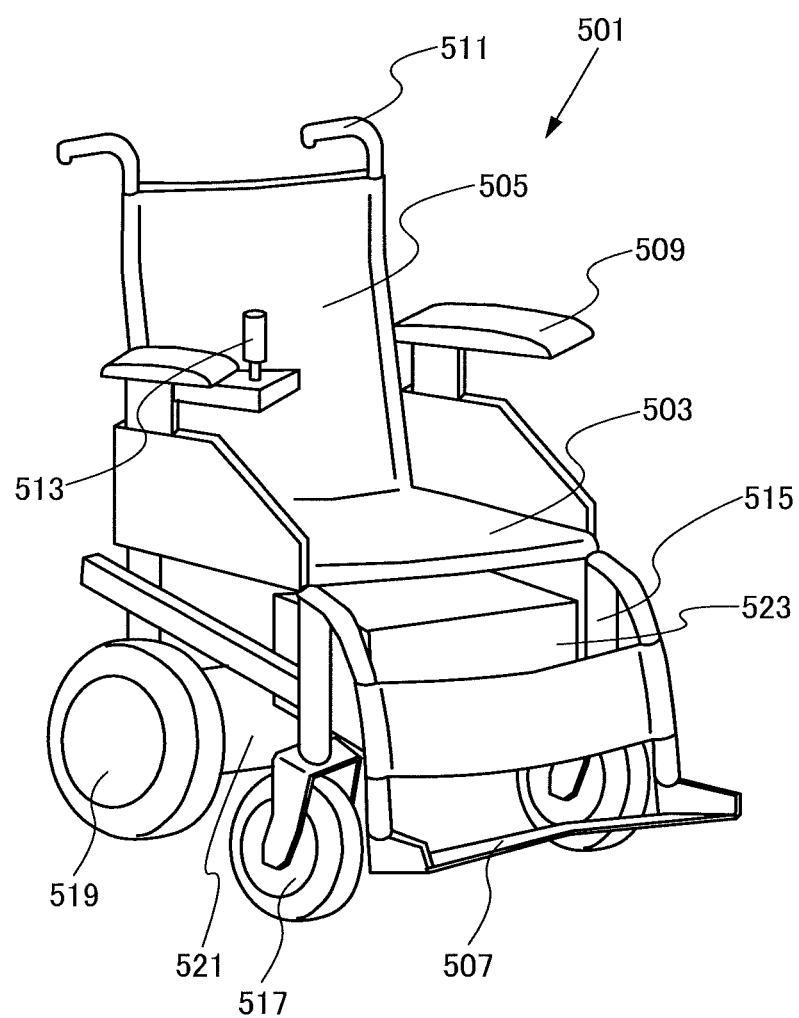
FIG. 9 is a perspective view illustrating an application example of an energy storage device.

FIG. 9 is a perspective view of an electric wheelchair 501. The electric wheelchair 501 includes a seat 503 where a user sits down, a backrest 505 provided behind the seat 503, a footrest 507 provided at the front of and below the seat 503, armrests 509 provided on the left and right of the seat 503, and a handle 511 provided above and behind the backrest 505. A controller 513 for controlling the operation of the wheelchair is provided for one of the armrests 509. A pair of front wheels 517 is provided at the front of and below the seat 503 through a frame 515 provided below the seat 503, and a pair of rear wheels 519 is provided behind and below the seat 503. The rear wheels 519 are connected to a driving portion 521 having a motor, a brake, a gear, and the like. A control portion 523 including a battery, a power controller, a control means, and the like is provided under the seat 503. The control portion 523 is connected to the controller 513 and the driving portion 521. The driving portion 521 drives through the control portion 523 with the operation of the controller 513 by the user and the control portion 521 controls the operation of moving forward, moving back, turning around, and the like, and the speed.

The energy storage device described in Embodiment 3 can be used in the battery of the control portion 523. The battery of the control portion 523 can be charged by power supply from the outside using plug-in systems. Note that in the case where the electric propulsion vehicle is a train vehicle, the train vehicle can be charged by power supply from an overhead cable or a conductor rail.

This application is based on Japanese Patent Application serial no. 2010-095305 filed with Japan Patent Office on Apr. 16, 2010, the entire contents of which are hereby incorporated by reference.

What is claimed is:

1. An electrode for an energy storage device comprising:
a current collector; and
an active material formed over the current collector,
wherein a surface of the active material is formed of a crystalline semiconductor film having a {110} crystal plane, and
wherein an orientation ratio of the crystalline semiconductor film on {110} plane is greater than or equal to 20%.

2. The electrode for an energy storage device according to claim 1, wherein the crystalline semiconductor film having a {110} crystal plane is a crystalline silicon film containing a metal element.

3. The electrode for an energy storage device according to claim 1, wherein the crystalline semiconductor film having a {110} crystal plane contains silicon as its main component and also contains germanium and a metal element.

4. The electrode for an energy storage device according to claim 2, wherein the metal element is a metal element which reacts with silicon to form a silicide.

5. The electrode for an energy storage device according to claim 2, wherein the metal element is selected from the group consisting of zirconium, titanium, hafnium, vanadium, niobium, tantalum, chromium, molybdenum, tungsten, cobalt, nickel, and platinum.

6. The electrode for an energy storage device according to claim 1, wherein the current collector is stainless steel, copper, or nickel.

7. An electrode for an energy storage device comprising:
a current collector; and
an active material formed over the current collector, the active material including a stack of:

a crystalline semiconductor film being in contact with the current collector and containing silicon as its main component and also containing germanium; and a crystalline silicon film being in contact with the crystalline semiconductor film, and having a {110} crystal plane, wherein an orientation ratio of the crystalline silicon film on {110} plane is greater than or equal to 20%.

8. The electrode for an energy storage device according to claim 7, wherein the metal element is a metal element which reacts with silicon to form a silicide.

9. The electrode for an energy storage device according to claim 7, wherein the metal element is selected from the group consisting of zirconium, titanium, hafnium, vanadium, niobium, tantalum, chromium, molybdenum, tungsten, cobalt, nickel, and platinum.

10. The electrode for an energy storage device according to claim 7, wherein the current collector is stainless steel, copper, or nickel.

11. An electrode for an energy storage device comprising:
a current collector; and
an active material formed over the current collector, the active material including a stack of:
a crystalline semiconductor film in contact with the current collector, the crystalline semiconductor film including silicon as its main component and a metal element and germanium; and
a crystalline silicon film in contact with the crystalline semiconductor film, the crystalline silicon film including the metal element,
wherein each of the crystalline semiconductor film and the crystalline semiconductor film has a {110} crystal plane,
wherein an orientation ratio of the crystalline semiconductor film on {110} plane is greater than or equal to 20%, and
wherein an orientation ratio of the crystalline silicon film on {110} plane is greater than or equal to 20%.

12. The electrode for an energy storage device according to claim 11, wherein the metal element is a metal element which reacts with silicon to form a silicide.

13. The electrode for an energy storage device according to claim 11, wherein the metal element is selected from the group consisting of zirconium, titanium, hathium, vanadium, niobium, tantalum, chromium, molybdenum, tungsten, cobalt, nickel, and platinum.

14. The electrode for an energy storage device according to claim 11, wherein the current collector is stainless steel, copper, or nickel.

15. A method for manufacturing an electrode for an energy storage device comprising the steps of:
forming an amorphous semiconductor film containing silicon as its main component and also containing germanium over a current collector;
adding a metal element to the amorphous semiconductor film; and
performing heat treatment on the amorphous semiconductor film after adding the metal element, whereby forming a crystalline semiconductor film;
wherein the crystalline semiconductor film has a {110} crystal plane, and
wherein an orientation ratio of the crystalline semiconductor film on {110} plane is greater than or equal to 20%.

16. The method for manufacturing an electrode for an energy storage device according to claim 15, wherein the metal element is a metal element which reacts with silicon to form a silicide.

17. The method for manufacturing an electrode for an energy storage device according to claim 15, wherein the metal element is selected form the group consisting of zirconium, titanium, hafnium, vanadium, niobium, tantalum, chromium, molybdenum, tungsten, cobalt, nickel, and platinum.

18. The method for manufacturing an electrode for an energy storage device according to claim 15, wherein the current collector is stainless steel, copper, nickel, tungsten, or molybdenum.

19. A method for manufacturing an electrode for an energy storage device comprising the steps of:
forming an amorphous semiconductor film containing silicon as its main component and germanium over a current collector;
forming an amorphous silicon film over the amorphous semiconductor film;
adding a metal element to the amorphous semiconductor film and the amorphous silicon film;
performing heat treatment on the amorphous semiconductor film and the amorphous silicon film after adding the metal element to crystallize the amorphous semiconductor film and the amorphous silicon film, whereby forming a crystalline semiconductor film and forming a crystalline silicon film over the crystalline semiconductor film;
wherein each of the crystalline semiconductor film and the crystalline silicon film has a {110} crystal plane,
wherein an orientation ratio of the crystalline semiconductor film on {110} plane is greater than or equal to 20%, and
wherein an orientation ratio of the crystalline silicon film on {110} plane is greater than or equal to 20%.

20. The method for manufacturing an electrode for an energy storage device according to claim 19, wherein the metal element is a metal element which reacts with silicon to form a silicide.

21. The method for manufacturing an electrode for an energy storage device according to claim 19, wherein the metal element is selected form the group consisting of zirconium, titanium, hafnium, vanadium, niobium, tantalum, chromium, molybdenum, tungsten, cobalt, nickel, and platinum.

22. The method for manufacturing an electrode for an energy storage device according to claim 19, wherein the current collector is stainless steel, copper, nickel, tungsten, or molybdenum.

* * * * *

UNITED STATES PATENT AND TRADEMARK OFFICE
CERTIFICATE OF CORRECTION

PATENT NO. : 8,940,610 B2  
APPLICATION NO. : 13/085234  
DATED : January 27, 2015  
INVENTOR(S) : Kazutaka Kuriki et al.

It is certified that error appears in the above-identified patent and that said Letters Patent is hereby corrected as shown below:

Specification

Column 4, line 49, after "100 nm" insert --.--; and

Claims

Column 19, line 44, claim 13, replace "hathium" with --hafnium--.

Signed and Sealed this
Twenty-seventh Day of October, 2015

Michelle K. Lee
*Director of the United States Patent and Trademark Office*